United States Patent
Khaderbad et al.

(10) Patent No.: US 10,515,849 B2
(45) Date of Patent: Dec. 24, 2019

(54) SEMICONDUCTOR DEVICE, INTERCONNECTION STRUCTURE AND METHOD FOR FORMING THE SAME

(71) Applicant: TAIWAN SEMICONDUCTOR MANUFACTURING CO., LTD., Hsinchu (TW)

(72) Inventors: Mrunal A. Khaderbad, Hsinchu (TW); Yasutoshi Okuno, Hsinchu (TW); Pang-Yen Tsai, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/940,872

(22) Filed: Mar. 29, 2018

(65) Prior Publication Data
US 2019/0164828 A1    May 30, 2019

Related U.S. Application Data
(60) Provisional application No. 62/592,988, filed on Nov. 30, 2017.

(51) Int. Cl.
| | | |
|---|---|---|
| H01L 21/768 | (2006.01) | |
| H01L 29/417 | (2006.01) | |
| H01L 21/285 | (2006.01) | |
| H01L 23/522 | (2006.01) | |
| H01L 21/3213 | (2006.01) | |

(52) U.S. Cl.
CPC .. *H01L 21/76879* (2013.01); *H01L 21/28562* (2013.01); *H01L 21/32134* (2013.01); *H01L 21/32137* (2013.01); *H01L 21/76804* (2013.01); *H01L 21/76805* (2013.01); *H01L 23/5226* (2013.01); *H01L 29/41791* (2013.01)

(58) Field of Classification Search
CPC combination set(s) only.
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2008/0160766 A1* | 7/2008 | Kim ............ H01L 21/3065 438/701 |
| 2008/0237876 A1* | 10/2008 | Sasagawa ...... H01L 21/76804 257/773 |

* cited by examiner

*Primary Examiner* — Ratisha Mehta
(74) *Attorney, Agent, or Firm* — Maschoff Brennan

(57) ABSTRACT

A semiconductor device is provided. The semiconductor device includes a source/drain region, a silicide layer on the source/drain region, an interlayer dielectric (ILD) layer over the silicide layer, and a source drain contact. The source/drain contact has a top portion extending through the ILD layer and a bottom portion embedded in the silicide layer.

20 Claims, 11 Drawing Sheets

US 10,515,849 B2

SEMICONDUCTOR DEVICE, INTERCONNECTION STRUCTURE AND METHOD FOR FORMING THE SAME

PRIORITY CLAIM AND CROSS-REFERENCE

This application claims priority to U.S. Provisional Application Ser. No. 62/592,988, filed Nov. 30, 2017, which is herein incorporated by reference.

BACKGROUND

The semiconductor integrated circuit (IC) industry has experienced rapid growth in the past several decades. Technological advances in semiconductor materials and design have produced increasingly smaller and more complex circuits. These material and design advances have been made possible as the technologies related to processing and manufacturing have also undergone technical advances. As a size of the smallest component has decreased, numerous challenges have risen. For example, interconnection of conductive lines and associated dielectric materials that facilitate wiring between the transistors and other devices play a role in IC performance improvement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
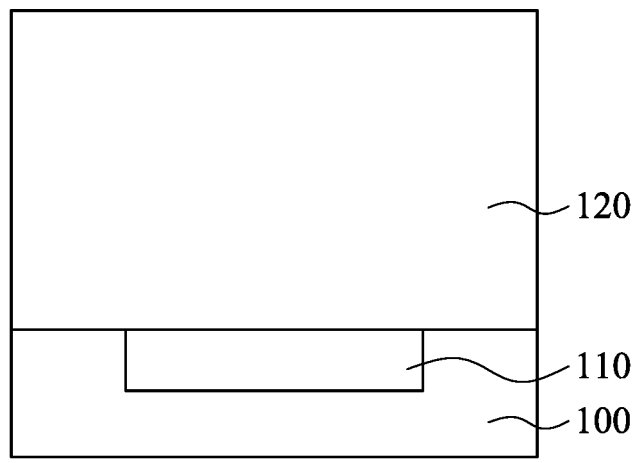
FIGS. 1 to 6 are cross-sectional views of intermediate stages in the formation of an interconnection structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1 to 5 are cross-sectional views of intermediate stages in the formation of an interconnection structure according to some embodiments of the present disclosure.

Reference is made to FIG. 1. A dielectric layer 120 is formed over a non-insulator structure 110. Herein, the non-insulator structure 110 is embedded in an underlying structure 100. In some embodiments, the underlying structure 100 may be an interlayer dielectric (ILD) layer over a front-end-of-line (FEOL) structure having, for example, transistors therein. The dielectric material of the ILD layer 100 may include tetrathoxysilane (TEOS), an extreme low-k (ELK) dielectric material, nitrogen-free anti-reflective coating (NFARC), silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), Xerogel, Aerogel, amorphous fluorinated carbon, parylene, BCB (bis-benzocyclobutenes), polyimide, or any combination thereof. The ELK dielectric material has a dielectric constant less than, for example, about 2.5. It is understood that the underlying structure 100 may include one or more dielectric materials and/or one or more dielectric layers. In some embodiments, the insulator structure 100 may be deposited by chemical vapor deposition (CVD), high density plasma (HDP) CVD, sub-atmospheric CVD (SACVD), spin-on coating, sputtering, or other suitable techniques.

The non-insulator structure 110 refers to a structure formed of one or more non-insulator materials, polysilicon, metal, conductive materials, semiconductor materials or combinations thereof. The non-insulator structure 110 can serve as a conductive line of an interconnect structure In some embodiments, when the non-insulator structure 110 serves as the conductive line (or metal line) of the interconnect structure, the non-insulator structure 110 may include a conductive material such as copper (Cu), tungsten (W), cobalt (Co), aluminum (Al), gold (Au), ruthenium (Ru) nickel (Ni), or the like, can alternatively be utilized. In some embodiments in which the non-insulator structure 210 is formed of copper, the non-insulator structure 210 may be deposited by electroplating techniques, although any method of formation can alternatively be used.

In some embodiments, when the non-insulator structure 110 serves as the source/drain region, an exemplary formation process may include doping an n-type dopant, such as phosphorous, or a p-type dopant, such as boron, into at least one portion of the semiconductor fin not covered by the spacers and the gate electrode by using ion implantation. Another exemplary process of forming the source/drain region may include forming at least one source/drain recess in the fin adjacent to the spacer, forming a seed layer in the source/drain recess, forming a relaxed epitaxial layer on the seed layer in the source/drain recess, forming an epitaxial layer on the relaxed epitaxial layer in the source/drain recess, so that the seed layer, the relaxed epitaxial layer and the epitaxial layer form a source/drain stressor to serve as the source/drain region. In some embodiments, the source/drain stressor includes, for example, SiP, SiP or SiCP, which is able to induce a tensile strain to the n-type channel in the semiconductor fin. In some other embodiments, the source/drain stressor includes SiGe, which is able to induce a compressive strain to the p-type channel in the semiconductor fin.

The dielectric layer 120 may be an interlayer dielectric (ILD) layer that includes a dielectric material. The dielectric material may include tetrathoxysilane (TEOS), a low-k (LK) dielectric material, an extreme low-k (ELK) dielectric material, nitrogen-free anti-reflective coating (NFARC), silicon oxide, silicon nitride, silicon oxynitride, silicon carbon nitride, phosphosilicate glass (PSG), borophosphosilicate glass (BPSG), spin-on glass (SOG), fluorinated silica glass (FSG), carbon doped silicon oxide (e.g., SiCOH), Xerogel, Aerogel, amorphous fluorinated carbon, Parylene, BCB (bis-benzocyclobutenes), polyimide, zirconium dioxide ($ZrO_2$), hafnium dioxide ($HfO_2$), or any combination thereof. The ELK dielectric material has a dielectric constant less than, for example, about 2.5. It is understood that the dielectric layer 120 may include one or more dielectric materials and/or one or more dielectric layers. In some embodiments, the dielectric layer 120 may be deposited by CVD, HDP CVD, SACVD, spin-on, sputtering, or other suitable techniques.

Figure 2:
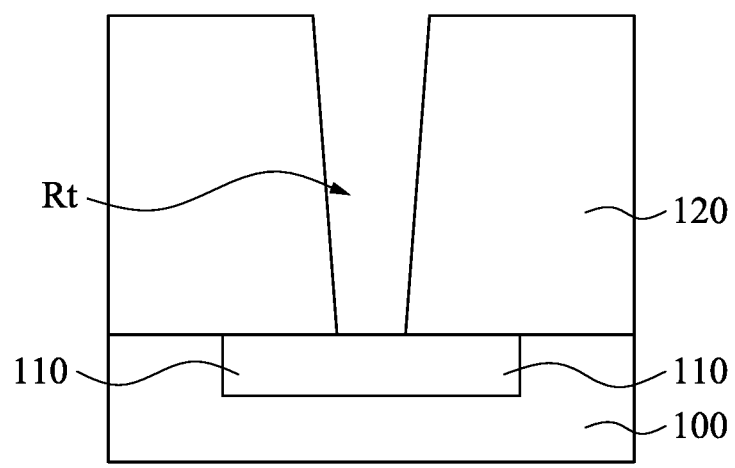

Reference is made to FIG. 2. An etching process is performed to the dielectric layer 120 to form a recess Rt therein, where the etchant etches through the dielectric layer 120 and expose the non-insulator structure 110. In some embodiments, the recess Rt tapers from the top of the dielectric layer 120 toward the bottom of the dielectric layer 120. That is, the top of the recess Rt has a width greater than the bottom of the recess Rt.

The etching process may be dry etching, wet etching, or combination thereof. The etching process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters that can be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 3:
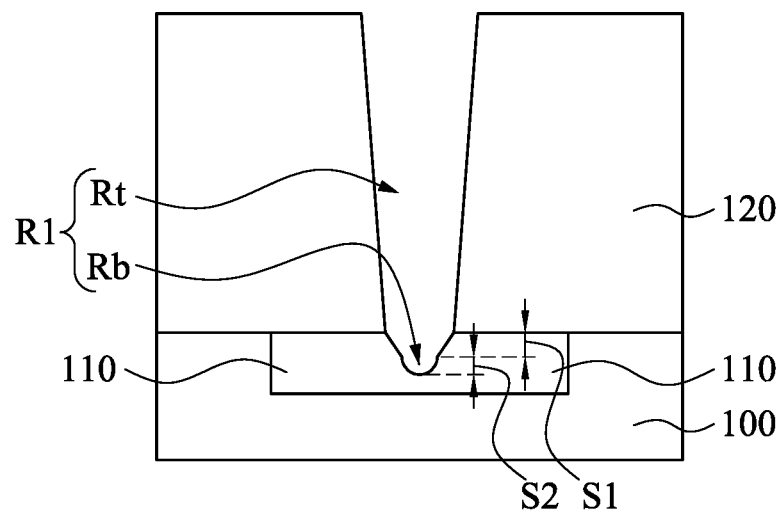

Reference is made to FIG. 3. An etching process is performed to the non-insulator structure 110 to form a recess Rb therein. The etching process may be dry etching, wet etching, or combination thereof. For example, dry etching process, such as plasma etching or other suitable etching, may be employed. The etchant etches the non-insulator structure 110 through the recess Rt of the dielectric layer 120, so as to form a recess Rb in the non-insulator structure 110. In some embodiments, the non-insulator structure 110 is recessed until reaching a level that does not expose the underlying structure 100. State another way, the etching process does not etch through the non-insulator structure 110 to expose the underlying structure 100. In some embodiments, the recess Rt and the recess Rb can be collectively referred to as a recess R1, where the recess Rt and the recess Rb can be also referred as the top portion and the bottom portion of the recess R1, respectively.

As shown in FIG. 3, in greater detail, the recess R1 has a top portion Rt in the dielectric layer 120 and a bottom portion Rb in the non-insulator structure 110, where the top portion Rt is in communication with the bottom portion Rb. The height of the bottom portion Rb may be in a range of about 0.1 nm to about 20 nm in some embodiments, or may be in a range of about 0.1 nm to about 15 nm in some other embodiments. In some embodiments, the width of the top portion Rt is greater than a maximal width of the bottom portion Rb.

In some embodiments, the bottom portion Rb of the recess R1 has a tapered profile that tapers from the top of the non-insulator structure 110 toward the bottom of the non-insulator structure 110, which in turn will facilitate the following bottom-up deposition using the capillary condensation mechanism, which will be discussed in detail below. In some embodiments, the bottom portion Rb has a first segment S1 and a second segment S2 below the first segment S1, where the first segment S1 is in communication with the second segment S2. In some embodiments, the non-insulator structure 110 may undergo an etching process that slight removes a portion of the non-insulator structure 110 to form the first segment S1, and another etching process may be performed to further form the second segment S2. In some embodiments, the width of the first segment S1 is greater than a maximal width of the second segment S2.

The first segment S1 of the recess Rt has substantially slant straight side surfaces. In some embodiments, the slope of the side surface of the first segment S1 of the recess Rb is substantially lower than that of the recess Rt. The second segment S2 of the recess Rb has substantially concave (rounded) bottom surface, and such shape in turn will be advantageous to increase the capillary condensation capability for filling a conductive material. In some embodiments, the radius of the curvature of the bottom surface of the recess Rb is in a range of about 1 nm to about 20 nm. Stated another way, the first segment S1 and the second segment S2 have different outer profiles.

The etching process used to etch the non-insulator structure 110 may include dry etching, wet etching, or combination thereof. In some embodiments, when the non-insulator structure 110 is made of cobalt (Co). The dry etching may be performed via a capacitive coupled plasma (CCP), an inductive coupled plasma (ICP) source, an electron cyclotron resonance (ECR) plasma, or combinations thereof. In some embodiments, the etching process may include etchant of $SiCl_4$ having a flow rate in a range of about 1 sccm to about 50 sccm. The etching process may include etchant gas of $Cl_2$ having a flow rate in a range of about 1 sccm to about 50 sccm. The etching process may include carrier gas of Ar, He, $N_2$, or the like, having a flow rate in a range of about 1 sccm to about 100 sccm. The etching process may be performed under pressure in a range of about 0.1 mTorr to about 1 Torr, RF bias power in a range of about 5 W to about 500 W, and temperature in a range of about 10° C. to 300° C. In some other embodiments, the dry etching may include etchants of $BCl_3$, $BBr_3$, $BF_3$, or $BI_3$ having a flow rate in a range of about 1 sccm to about 100 sccm. The etching process may include carrier gas of Ar, He, $N_2$, or the like, having a flow rate in a range of about 1 sccm to about 100 sccm. The etching process may be performed under pressure in a range of about 0.1 mTorr to about 1 Torr, RF bias power in a range of about 5 W to about 500 W, and temperature in a range of about 10° C. to 300° C. The wet etching may include etchants of $H_2O_2$ and $HNO_3$ in a ratio of about 1:1, or etchants of HCl and $H_2O_2$ in a ratio of about 3:1.

In some embodiments, when the non-insulator structure 110 is made of titanium silicide. The dry etching may be performed via a capacitive coupled plasma (CCP), an inductive coupled plasma (ICP) source, an electron cyclotron resonance (ECR) plasma, or combinations thereof, with etchants of $CF_4$ and $O_2$. The wet etching may include etchants of HF and $H_2O$ in a ratio of about 1:1 to 1000, or etchants of $NH_4F$ and $H_2O_2$ in a ratio of about 1:1 to 1000.

In some embodiments, when the non-insulator structure 110 is made of tungsten. The dry etching may be performed via a capacitive coupled plasma (CCP), an inductive coupled plasma (ICP) source, an electron cyclotron resonance (ECR) plasma, or combinations thereof. In some embodiments, the etching process may include etchant of $BCl_3$ or $SF_6$. The etching process may include etchant gases of $CBrF_3$ having a flow rate in a range of about 1 sccm to about 50 sccm, $CClF_3$ having a flow rate in a range of about 1 sccm to about 50 sccm, and $CF_4$ having a flow rate in a range of about 1 sccm to about 50 sccm with or without $O_2$. The etching process may include carrier gas of Ar, He, $N_2$, or the like, having a flow rate in a range of about 1 sccm to about 100 sccm. The etching process may be performed under pressure in a range of about 0.1 mTorr to about 1 Torr, RF bias power in a range of about 5 W to about 500 W, and temperature in a range of about 10° C. to 300° C.

In some embodiments, when the non-insulator structure 110 is made of titanium nitride (TiN). The dry etching may be performed via a capacitive coupled plasma (CCP), an inductive coupled plasma (ICP) source, an electron cyclotron resonance (ECR) plasma, or combinations thereof. In some embodiments, the etching process may include etchant of $CHF_3$, $Cl_2$, or $BCl_3$ having a flow rate in a range of about 1 sccm to about 500 sccm. The etching process may include carrier gas of Ar, He, $N_2$, or the like, having a flow rate in a range of about 1 sccm to about 100 sccm. The etching process may be performed under pressure in a range of about 0.1 mTorr to about 1 Torr, RF bias power in a range of about 5 W to about 500 W, and temperature in a range of about 10° C. to 300° C.

In some embodiments, the parameters of the etching process are tuned to reduce the radius of curvature of the bottom surface of the second segment S2 of the recess Rb, since a small radius of the curvature at the bottom may induce high capillary force for filling a conductive material. For Co, the etch solution may contain Dilute HF 1:X in DI water for etch time y sec, where x is between 50 to 200 and y is between 5 to 60 sec. SC-1 or SC-2 can be used for obtaining recess in bottom metals. For metals like Ru, W and Co, alternating cycles of Cl based plasmas are used (where gases like $SiCl_4$, $BCl_3$ or $Cl_2$) followed by Ar ion plasma for etching with plasma power range from 10 to 500 W, gas flows from 5 to 200 sccm, pressures from 1 mTorr to 50 mTorr and time range from 0.5 to 5 sec. Alternatively for Ru, $O_2$ plasma can be used with and without following by Ar ion plasma with plasma power range from 10 to 500 W, gas flows from 5 to 200 sccm, pressures from 1 mTorr to 50 mTorr and time range from 0.5 to 5 sec. For W, fluorine based plasma can be used with gases like $SF_6$, $CF_4$, $CBrF_3$, and $CHF_3$ mixed with or without oxygen, with plasma power range from 10 to 500 W, gas flows from 5 to 200 sccm, pressures from 1 mTorr to 50 mTorr and time range from 0.5 to 5 sec.

Figure 4:
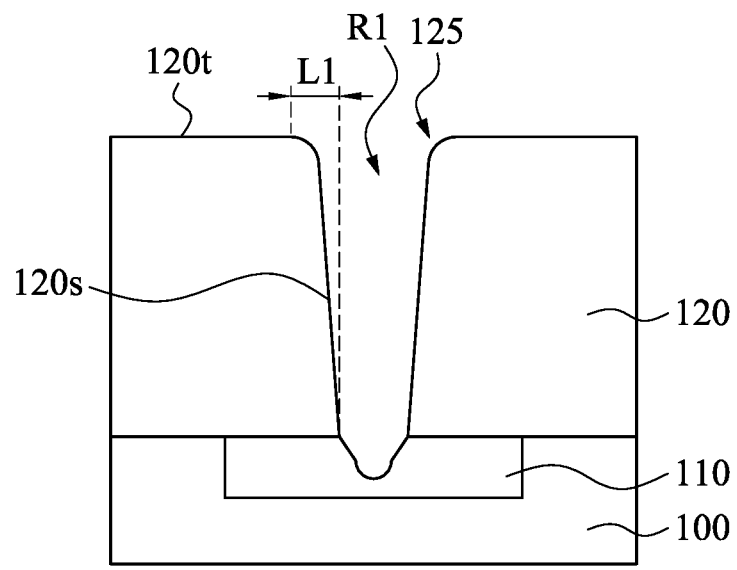

Reference is made to FIG. 4. The top corners of the recess R1 are rounded, so as to change sharp top corners of the recess R1 into rounded top corners 125, which in turn will further enlarge the recess R1 and facilitate the filling characteristic of the recess R1. The corners 125 are rounded substantially with the radius of curvature in a range of about 1 nm to about 30 nm. The horizontal length L between the top surface 120t of the dielectric layer 120 and the bottom of the sidewall 120s of the dielectric layer 120 may be defined as corner length L1. In some embodiments, the corner length L1 is in a range of about 0 nm to about 15 nm.

The corners 125 may be rounded by an etching process that etches the material(s) of the dielectric layer 120 that makes up the corners 125. The etching process may be dry etching, wet etching, or combinations thereof. The removal of the dielectric layer 120 during the etching process starts at the corners of recess R1 that have been created and progressively continues from these corners 125 down into the sidewalls of the recess R1. In some embodiments, the parameters of the etching process are tuned to increase the radius of curvature of the corners 125, which in turn will increase the capillary condensation capability for filling a conductive material, since the conductive material may flow easily down to the bottom of the recess R1.

Figure 5:
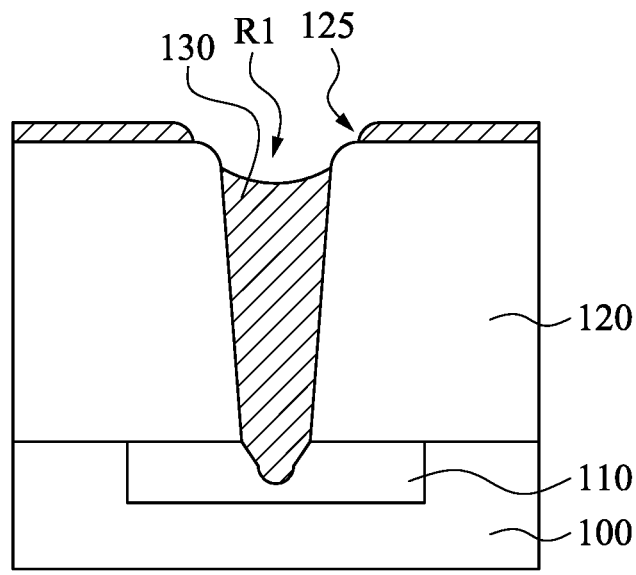

Reference is made to FIG. 5. A conductive material 130 is deposited into the recess R1 using a bottom-up approach, so that the recess R1 can be substantially filled with the conductive material 130. As mentioned before, the bottom portion Rb of the recess R1 has a tapered profile (e.g. a concave (rounded) bottom surface shown in FIG. 3), which enhances the capillary condensation capability of conductive material 130. In certain embodiments, the bottom-up deposition is a CVD deposition process involving capillary condensation mechanisms and thus is equivalently referred to as a capillary condensation CVD process hereinafter.

The capillary condensation CVD process selectively deposits metal in the narrowest confined space on the substrate, such as the bottom portion of the recess R1 in the non-insulator structure. The precursor of the capillary condensation CVD process is initially provided in a vapor phase at a partial pressure (e.g., from 0.1 mTorr to about 100 mTorr) below its saturation pressure. Due to capillary condensation, the precursor vapor condenses as a liquid in the narrowest gaps (i.e., the recess Rb) even if the partial pressure of the precursor vapor is below its saturation pressure. This is due to an increased number of van der Waals interactions between vapor phase molecules inside the confined space of capillaries (i.e., the recess Rb). This propensity is employed to selectively fill the recess Rb with the precursor liquid. With the precursor liquid selectively confined to narrowest space, the precursor liquid is converted into a solid-phase deposited metal. This conversion may be achieved physically for example by solidification, or chemically by reacting the precursor liquid with another material to produce the solid material, or by decomposing the precursor.

Metal deposition using the capillary condensation CVD begins from the narrowest confined space, which in turn results in the "bottom-up" filling phenomenon, which in turn results in the recess Rb substantially filled with the conductive material 130. In some embodiments, the capillary condensation CVD process is performed until that the recess R1 is substantially filled with the noble metal, as illustrated in FIG. 5.

In some embodiments, the precursor of the capillary condensation CVD may be, for example, metal carbonyl, metal halide, the like or combinations thereof, and the carrier gas may include, for example, argon gas, hydrogen gas, the like, or combinations thereof. In some embodiments, an additional inhibition gas is employed during the capillary condensation CVD process. The inhibition gas results in improved "bottom-up" filling phenomenon because it inhibits metal nucleation on dielectric (e.g., on sidewalls of recess Rt in the dielectric layer 120). In some embodiments where the precursor includes metal carbonyl, the inhibition gas includes, for example, carbon monoxide (CO). In some embodiments where the precursor includes metal halide, the inhibition gas includes, for example, hydrogen halide.

In some other embodiments, an additional inhibition material can be formed on sidewalls of recess Rt in the dielectric layer 120 prior to the capillary condensation CVD process. The inhibition material results in improved "bottom-up" filling phenomenon because it inhibits metal nucleation on dielectric (e.g., on sidewalls of recess Rt in the dielectric layer 120). In some embodiments where the precursor includes metal carbonyl, the inhibition gas includes, for example, carbon monoxide (CO). In some embodiments where the precursor includes metal halide, the inhibition gas includes, for example, hydrogen halide. The inhibition material may include $SiOC_xH_y$, $SiOC_xCl_y$, or $SiOC_xF_y$. Thus, in some embodiments when the inhibition material is employed, the inhibition material (not shown) may present between the conductive material and the dielectric layer 120.

In some embodiments, a noble metal (e.g., ruthenium) is a promising candidate for the conductive material 130 compared to other metals such as copper. This is due to the noble metal exhibits lower metal diffusion than other metals (e.g., copper). As a result, a diffusion barrier layer deposited prior to formation of the conductive material 130 may be omitted if the conductive material 130 include the noble metal. Omission of the diffusion barrier will contributes to an improved process window for depositing the conductive material 130 into the recess R1.

In some embodiments, a pre-clean process is performed prior to the capillary CVD process. The pre-clean includes ion bombardment using a gas including hydrogen ($H_2$), argon, helium, nitrogen ($N_2$), the like, or combinations thereof. As a result of the bombardment, bonds of the materials (such as silicon oxide and/or nitride) exposed by the recess R1 may be broken or loosen, which will facilitate formation of the conductive material 130 by reacting the noble metal with elements resulting from the broken bonds.

In some embodiments where the noble metal is ruthenium, the precursor may be, for example, ruthenium carbonyl, ruthenium tricarbonyl, ruthenium halide, the like or combinations thereof, and the carrier gas may include, for example, argon gas, hydrogen gas, the like or combinations thereof. In certain embodiments where the precursor is ruthenium tricarbonyl, the formation of conductive material 130 may be a cyclic process including at least one repetition of a deposition cycle and a cleaning cycle. For example, it may perform a deposition cycle followed by a cleaning cycle, and repeats the deposition and etching cycles. In some embodiments, the deposition cycle involves the capillary condensation CVD process as discussed previously and the cleaning cycle involves treating the recess R1 with ion bombardment performed using a gas including hydrogen ($H_2$), argon, helium, nitrogen ($N_2$), the like, or combinations thereof. The ion bombardment is advantageous for forming the conductive material 130 on the sidewalls of the recess R1 as discussed previously.

In some embodiments, if the conductive material 130 servers as a source/drain contact, the conductive material 130 may include low resistivity metal without barrier, such as ruthenium (Ru), iridium (Ir), nickel (Ni), osmium (Os), rhodium (Rh), aluminum (Al), molybdenum (Mo), tungsten (W), cobalt (Co), copper (Cu), or the like, can alternatively be utilized. In some other embodiments, if the conductive material 130 servers as conductive line or the conductive via of the interconnect structure, the conductive material 130 may include cobalt (Co), copper (Cu), ruthenium (Ru), nickel (Ni), aluminum (Al), platinum (Pt), molybdenum (Mo), tungsten (W), osmium (Os), iridium (Ir), chromium (Cr), or the like, can alternatively be utilized.

The conductive material 130 may be deposited by suitable process, such as CVD, PVD, or ALD. In some embodiments, the conductive material 130 may be deposited by CVD using a low vapor pressure precursor, such as $Cr(CO)_6$, $Co_4(CO)_{12}$, $Ru_3(CO)_{12}$, $Os_3(CO)_{12}$, $W(CO)_6$ for CVD, since the low vapor pressure precursor is more liquid-like and flows easily down to the recess. In some embodiments, the conductive material 130 may be deposited using carrier gas of oxygen ($O_2$), carbon (C), argon (Ar), nitrogen ($N_2$) or hydrogen ($H_2$) as carrier gas with flow rate in a range of about 1 to 500 sccm.

Figure 6:
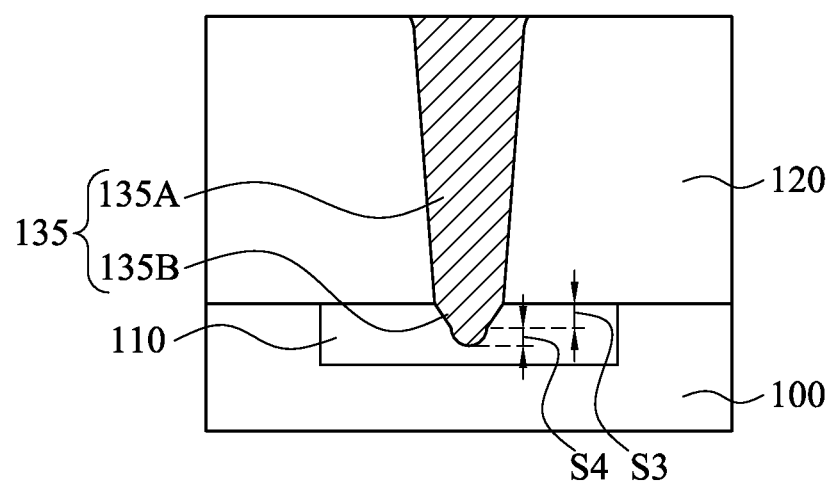

Reference is made to FIG. 6. A chemical planarization polishing (CMP) is performed to remove the excessive conductive material 130 until reaching the top surface of the dielectric layer 120. The remaining conductive material 130 in the recess R1 may be referred to as conductive feature 135 in the following description, where the top surface of the conductive feature 135 is substantially level with that of the dielectric layer 120. In some embodiments, the conductive feature 135 may also be referred to as conductive via (or metal via).

The conductive feature 135 substantially inherits the profile of the recess R1 shown in FIG. 3. As illustrated, the conductive feature 135 has a top portion 135A and a bottom portion 135B, where the top portion 135A is between the dielectric layer 120, and the bottom portion 135B is embedded in the non-insulator structure 110. The top portion 135A has a tapered profile that tapers from the top of the conductive feature 135 to the bottom of the conductive feature 135. That is, the top of the conductive feature 135A is wider than the bottom of the conductive feature 135A. On the other hand, the bottom portion 135B embedded in the non-insulator structure 110 has a tapered profile that tapers from the top of the non-insulator structure 110 toward the bottom of the non-insulator structure 110. In some embodiments, the bottom portion 135B of the conductive feature 135 has a first segment S3 and a second segment S4 below the first segment S3. The first segment S3 of the conductive feature 135B has substantially slant straight side surfaces. In some embodiments, the slope of the side surface of the first segment S3 of the conductive feature 135B is substantially lower than that of the conductive feature 135A. The second segment S4 of the conductive feature 135B has substantially rounded bottom surface. In some embodiments, the radius of the curvature of the bottom surface of the conductive feature 135B is in a range of about 1 nm to about 20 nm. Stated another way, the first segment S3 and the second segment S4 have different outer profiles.

Figure 7A:
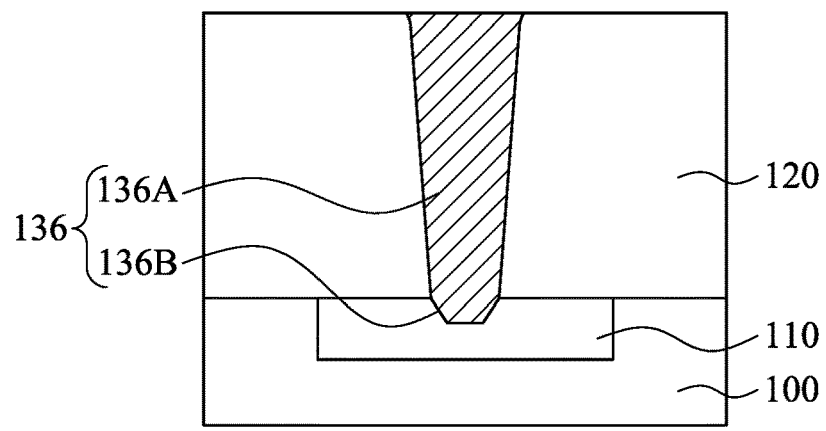
FIGS. 7A to 7C are cross-sectional views of interconnection structures according to some embodiments of the present disclosure.
Figure 7B:
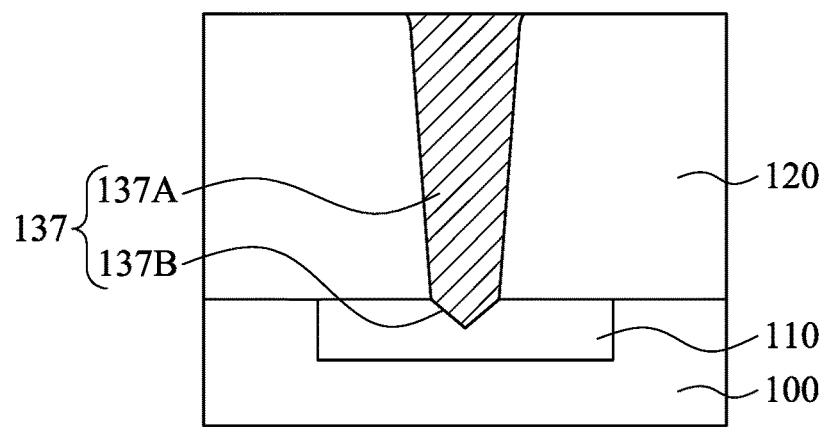
Figure 7C:
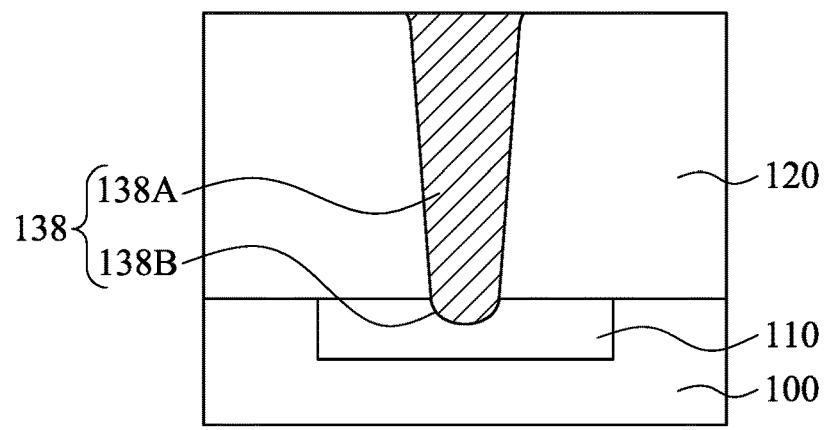

FIGS. 7A to 7C are cross-sectional views of interconnection structures according to some embodiments of the present disclosure.

As shown in FIG. 7A, many aspects of the interconnection structure of FIG. 7A are the same as or similar to those described in FIGS. 1 to 6. For example, the interconnection structure in some embodiments also includes the underlying structure 100, the non-insulator structure 110, and the dielectric layer 120. In contrast, shown there is a conductive feature 136 that is different in shape from the conductive feature 135 of FIG. 6.

As illustrated, the conductive feature 136 has a top portion 136A and a bottom portion 136B, where the top portion 136A is between the dielectric layer 120, and the bottom portion 136B is embedded in the non-insulator structure 110. The top portion 136A has a tapered profile that is similar to the top portion 135A of the conductive feature 135 of FIG. 6. The bottom portion 136B of the conductive feature 136 embedded in the non-insulator structure 110 is in a shape of trapezoid. State another way, the bottom portion 136B of the conductive feature 136 has substantially slant straight side surfaces that intersect with a substantially flat bottom surface. In some embodiments, the slope of the side surface of the bottom portion 136B of the conductive feature 136 is substantially lower than that of the top portion 136A of the conductive feature 136. In some embodiments, the shape of the bottom portion 136B of the conductive feature 136 may be achieved by etching the non-insulator structure 110 to have a recess with desired shape, and filling the recess with conductive material. In some embodiments, the etching process may be a dry etching, a wet etching, or combinations thereof.

As shown in FIG. 7B, many aspects of the interconnection structure of FIG. 7B are the same as or similar to those described in FIGS. 1 to 6. For example, the interconnection structure in some embodiments also includes the underlying structure 100, the non-insulator structure 110, and the dielectric layer 120. In contrast, shown there is a conductive feature 137 that is different in shape from the conductive feature 135 of FIG. 6.

As illustrated, the conductive feature 137 has a top portion 137A and a bottom portion 137B, where the top portion 137A is between the dielectric layer 120, and the bottom portion 137B is embedded in the non-insulator structure 110. The top portion 137A has a tapered profile that is similar to the top portion 135A of the conductive feature 135 of FIG. 5. The bottom portion 137B of the conductive feature 137 embedded in the non-insulator structure 110 is in a shape of triangle. State another way, the bottom portion 137B of the conductive feature 137 has substantially slant straight side surfaces that intersect at a bottommost point of the conductive feature 137. That is, the bottom portion 137B of the conductive feature 137 has a pointed tip. In some embodiments, the slope of the side surface of the bottom portion 137B of the conductive feature 137 is substantially lower than that of the top portion 137A of the conductive feature 137. In some embodiments, the shape of the bottom portion 137B of the conductive feature 137 may be achieved by etching the non-insulator structure 110 to have a recess with desired shape, and filling the recess with conductive material. In some embodiments, the etching process may be a dry etching, a wet etching, or combinations thereof.

As shown in FIG. 7C, many aspects of the interconnection structure of FIG. 7C are the same as or similar to those described in FIGS. 1 to 6. For example, the interconnection structure in some embodiments also includes the underlying structure 100, the non-insulator structure 110, and the dielectric layer 120. In contrast, shown there is a conductive feature 138 that is different in shape from the conductive feature 135 of FIG. 6.

As illustrated, the conductive feature 138 has a top portion 138A and a bottom portion 138B, where the top portion 138A is between the dielectric layer 120, and the bottom portion 138B is embedded in the non-insulator structure 110. The top portion 138A has a tapered profile that is similar to the top portion 135A of the conductive feature 135 of FIG. 5. The bottom portion 138B of the conductive feature 138 embedded in the non-insulator structure 110 is in a shape of curve with a radius of curvature in a range of about 1 nm to 20 nm in some embodiments. In some embodiments, the slope of the side surface of the bottom portion 138B of the conductive feature 138 gradually decreases from the junction between portions 138A and 138B to the bottommost of the bottom portion 138B. In greater detail, the slope of the side surface of the bottom portion 138B of the conductive feature 138 is substantially lower than that of the top portion 138A of the conductive feature 138. In some embodiments, the shape of the bottom portion 138B of the conductive feature 138 may be achieved by etching the non-insulator structure 110 to have a recess with desired shape, and filling the recess with conductive material. In some embodiments, the etching process may be a dry etching, a wet etching, or combinations thereof.

FIGS. 8 to 18B illustrate a method of manufacturing a semiconductor device at various stages in accordance with some embodiments.

Figure 8:
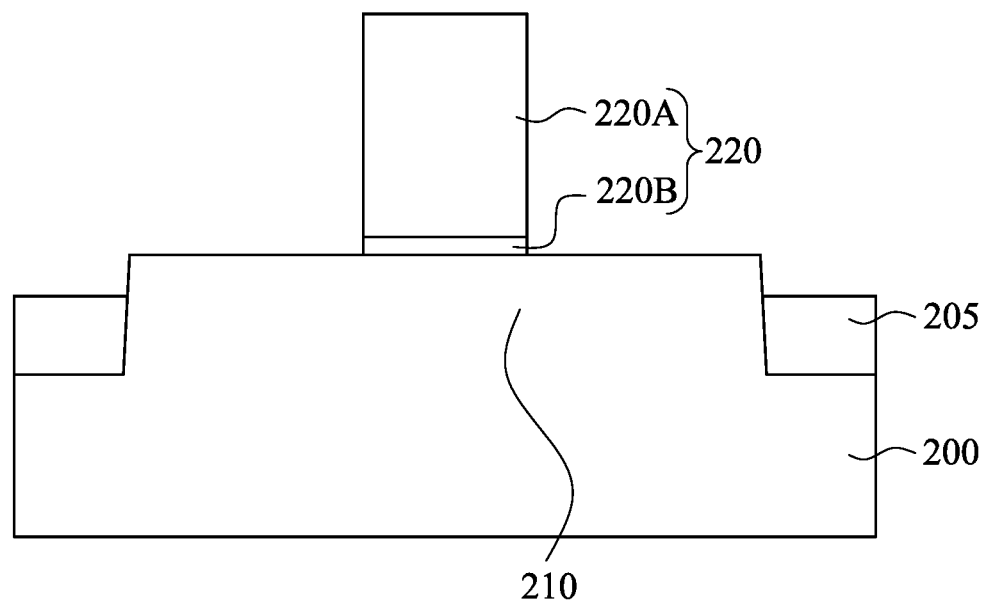
FIGS. 8 to 18B illustrate a method of manufacturing a semiconductor device at various stages in accordance with some embodiments.

Reference is made to FIG. 8. A semiconductor fin 210 is formed over a substrate 200. The substrate 200 may be a bulk silicon substrate. Alternatively, the substrate 200 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 200 also include a silicon-on-insulator (SOI) substrate. SOI substrates are fabricated using separation by implantation of oxygen (SIMOX), wafer bonding, and/or other suitable methods.

The fin 210 may be patterned using one or more photolithography processes, including double-patterning or multi-patterning processes. Double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin 210 by etching the initial layers. The etching process can include dry etching, wet etching, reactive ion etching (RIE), and/or other suitable processes.

A plurality of isolation structures 205 are formed over the substrate 100 and adjacent to the semiconductor fin 210. The isolation structures 205, which act as a shallow trench isolation (STI) around the semiconductor fin 210 may be formed by chemical vapor deposition (CVD) techniques using tetra-ethyl-ortho-silicate (TEOS) and oxygen as a precursor. In yet some other embodiments, the isolation structures 205 are insulator layers of a SOI wafer.

A dummy gate stack 220 is formed over the semiconductor fin 210 of the substrate 200. The dummy gate stack 220 may be formed by, for example, depositing a dummy gate layer over the semiconductor fin 210 of the substrate 200. A patterned mask (not shown) may be deposited sequentially over the dummy gate layer to define the position of the dummy gate stack 220. An etching process is then performed to pattern the dummy gate layer to form the dummy gate stack 220.

In some embodiments, the dummy gate stack 220 includes a dummy gate 220A and a gate dielectric 220B underlying the dummy gate 220A. The dummy gate 220A may include polycrystalline-silicon (poly-Si) or poly-crystalline silicon-germanium (poly-SiGe) and may be formed by suitable deposition processes such as low-pressure chemical vapor deposition (LPCVD) and plasma-enhanced CVD (PECVD). Further, the dummy gate 220A may be doped poly-silicon with uniform or non-uniform doping. In some embodiments, the gate dielectric 220B may include a dielectric material such as silicon oxide layer (e.g., $SiO_2$) or silicon oxynitride (e.g., SiON), and may be formed by chemical oxidation, thermal oxidation, atomic layer deposition (ALD), chemical vapor deposition (CVD), and/or other suitable methods. In other embodiments, the gate dielectric 220B may include, for example, a high-k dielectric material such as metal oxides, metal nitrides, metal silicates, transition metal-oxides, transition metal-nitrides, transition metal-silicates, oxynitrides of metals, metal aluminates, zirconium silicate, zirconium aluminate, or combinations thereof.

Figure 9:
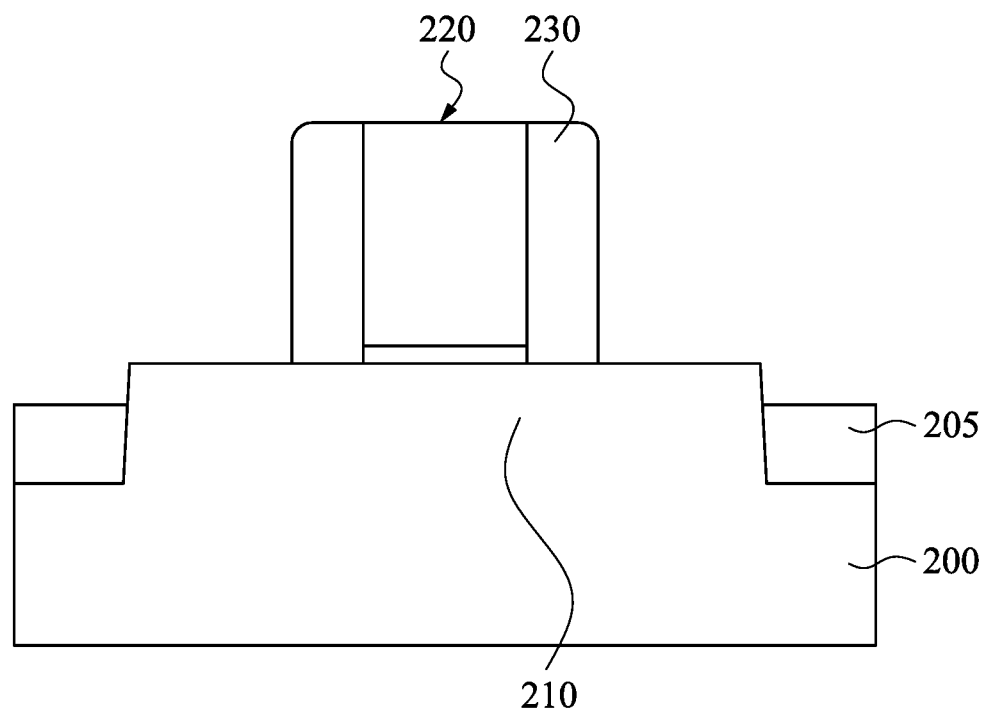

Reference is made to FIG. 9. Gate spacers 230 are formed on the fin 210 and respectively along opposite sides of the dummy gate stack 220. The gate spacers 230 may include a single layer or multilayer structure. To form the gate spacers 230, a blanket layer may be formed on the substrate 200 by CVD, PVD, ALD, or other suitable technique. Then, an anisotropic etching is performed on the blanket layer to form the gate spacers 230 respectively on opposite sides of the dummy gate stack 220. In some embodiments, the gate spacers 230 can be used to offset subsequently formed doped regions, such as source/drain regions. The gate spacers 230 can further be used for designing or modifying the source/drain region (junction) profile.

Figure 10:
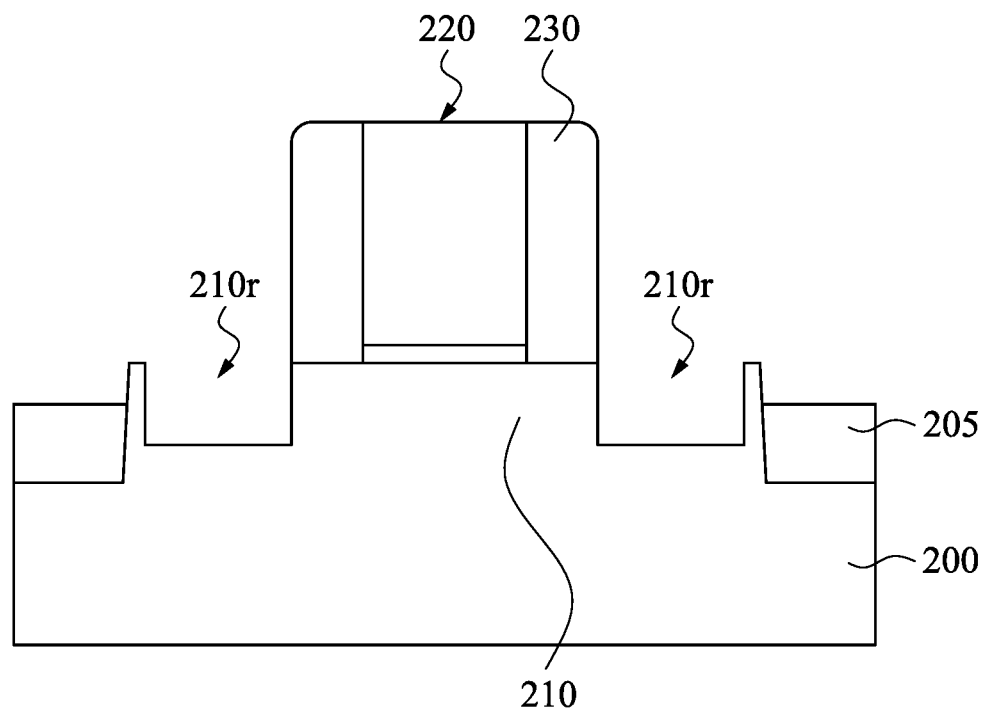

Reference is made to FIG. 10. Portions of the semiconductor fin 210 exposed by the dummy gate stack 220 and the gate spacers 230 are removed (or recessed) to form recesses 210r in the substrate 200. Any suitable amount of material may be removed. Removing portions of the semiconductor fin 210 may include forming a photoresist layer or a capping layer (such as an oxide capping layer) over the structure of FIG. 9, patterning the photoresist or capping layer to have openings that expose portions of the semiconductor fin 210, and etching the exposed portions of the semiconductor fin 210. In some embodiments, the semiconductor fin 210 can be etched using a dry etching process. Alternatively, the etching process is a wet etching process, or combination of dry and wet etching process. Removal may include a lithography process to facilitate the etching process. The lithography process may include photoresist coating (e.g., spin-on coating), soft baking, mask aligning, exposure, post-exposure baking, developing the photoresist, rinsing, drying (e.g., hard baking), other suitable processes, or combinations thereof. Alternatively, the lithography process is implemented or replaced by other methods, such as maskless photolithography, electron-beam writing, and ion-beam writing. In yet some other embodiments, the lithography process could implement nanoimprint technology. In some embodiments, a pre-cleaning process may be performed to clean the recesses 210r with HF or other suitable solution.

Figure 11:
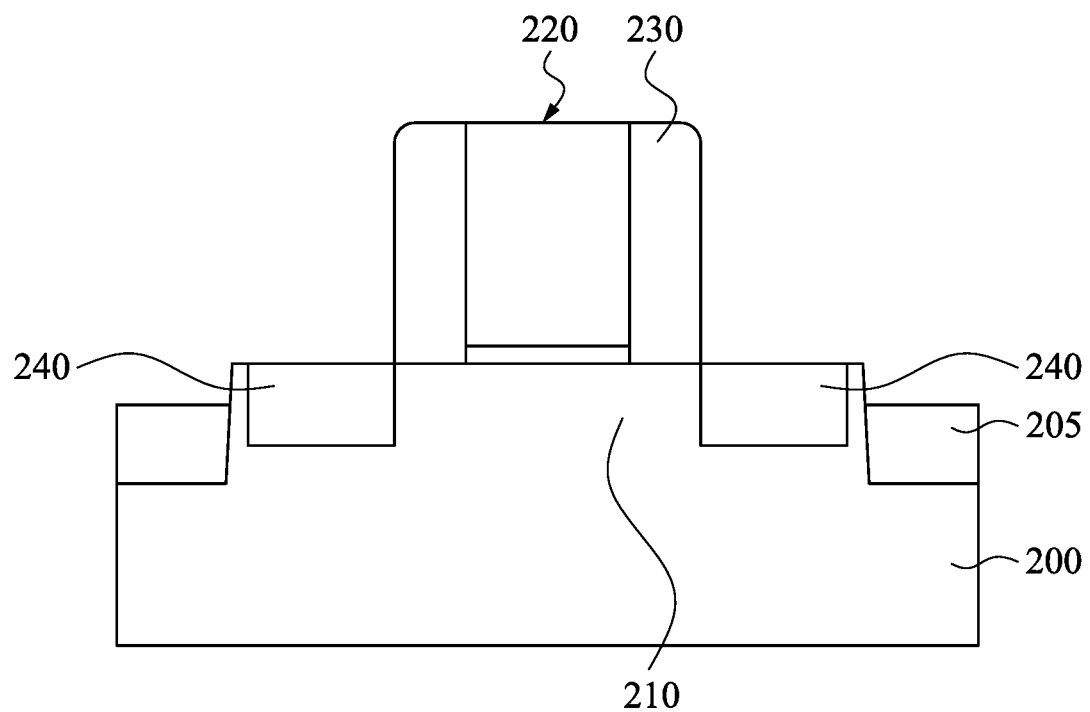

Reference is made to FIG. 11. A plurality of epitaxy structures 240 are respectively formed in the recesses 210r (see FIG. 10) to act as source/drain regions of a transistor. The epitaxy structures 240 may be formed using one or more epitaxy or epitaxial (epi) processes, such that Si features, SiGe features, and/or other suitable features can be formed in a crystalline state on the semiconductor fin 210. In some embodiments, the lattice constant of the epitaxy structures 240 are different from the lattice constant of the semiconductor fin 210, so that the channel can be strained or stressed by the epitaxy structures 240 to improve carrier mobility of the semiconductor device and enhance the device performance. The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 210 (e.g., silicon). Thus, strained or stressed semiconductor channel can be achieved to increase carrier mobility and enhance device performance. The epitaxy structures 240 may be in-situ doped. The doping species include P-type dopants, such as boron or $BF_2$; N-type dopants, such as phosphorus or arsenic; and/or other suitable dopants including combinations thereof. If the epitaxy structures 240 are not in-situ doped, a second implantation process (i.e., a junction implant process) is performed to dope the epitaxy structures 240. One or more annealing processes may be performed to activate the epitaxy structures 240. The annealing processes include rapid thermal annealing (RTA) and/or laser annealing processes.

Figure 12:
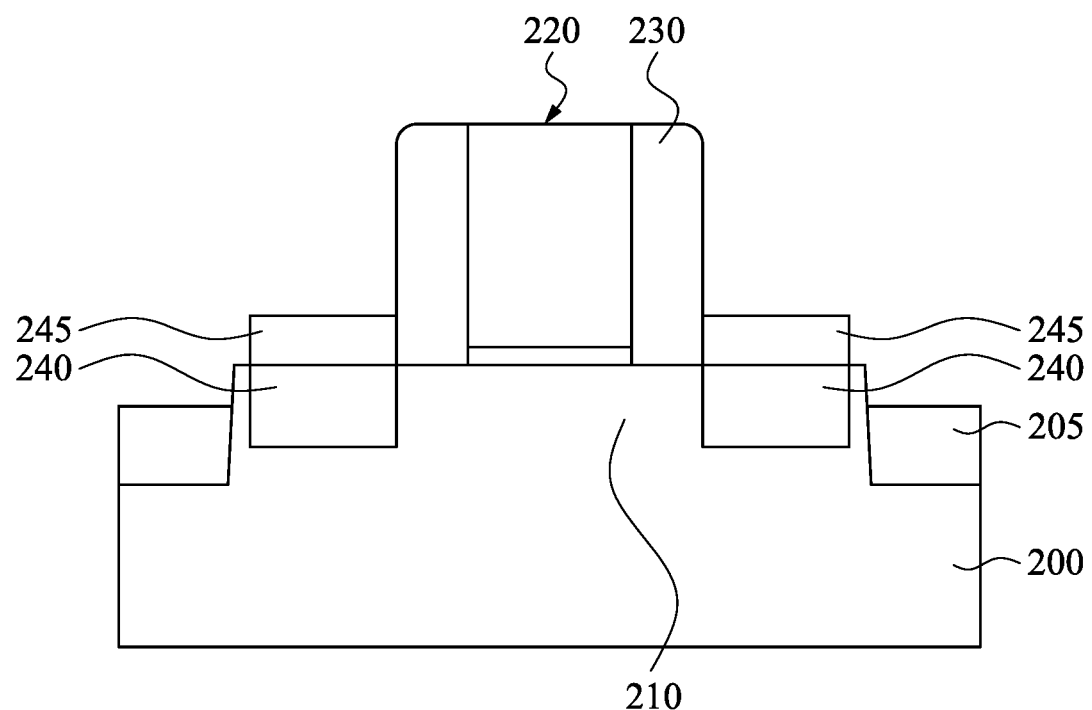

Reference is made to FIG. 12. Silicide layers 245 are formed respectively on the epitaxy structures 240 by a self-aligned silicide (salicide) process. A silicide process involves deposition of, for example, a transition metal to form a thin layer by a suitable process such as CVD, application of heat to allow the transition metal to sinter with exposed material in the active regions (source and drain), for example, the epitaxy structures 240, to form a low-resistance transition metal silicide. The silicide layers 245 may include such materials as nickel silicide, cobalt silicide, tungsten silicide, tantalum silicide, titanium silicide, platinum silicide, erbium silicide, palladium silicide, and/or combinations thereof. The silicide layers 245 may be formed by silicidation such as self-aligned silicide (Salicide), in which a metal is deposited, reacted with silicon during an annealing process, and then the unreacted metal is removed by etch. Particularly, after the metal deposition, temperature is raised to for annealing to enhance reaction between Si and metal to form silicide, finally unreacted metal may be etched away. Annealing may be one step or multi-step annealing depending on metal material and other conditions. Alternatively, the silicide layers 245 may be formed by a procedure including silicide deposition, such as CVD, PVD, or ALD.

As an example, the deposited metal layer includes titanium (Ti). After the metal deposition (e.g. Ti), an annealing process is applied to react the metal (e.g. Ti) with silicon of the epitaxy structures 240, thereby forming the silicide layers 245, such as Ti silicide (TiSi). An etching process then follows to remove unreacted Ti layer.

Figure 13:
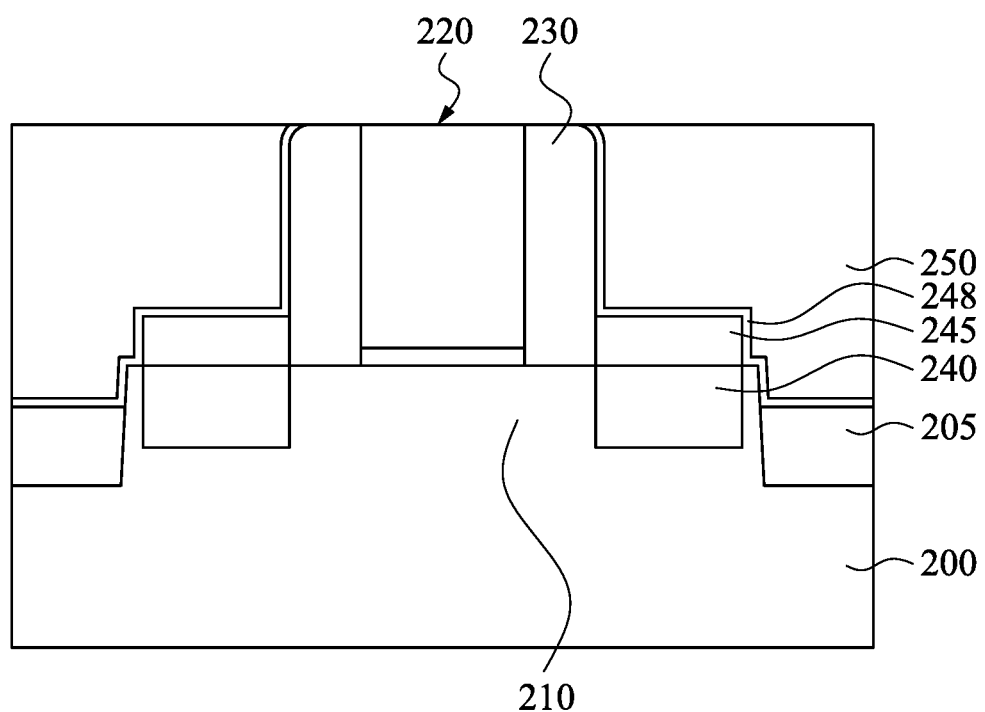

Reference is made to FIG. 13. An inter-layer dielectric (ILD) layer 250 is formed over the substrate 200. Accordingly, the interlayer dielectric 250 covers the silicide layers 245 and portions of the semiconductor fin 210 of the substrate 200. The interlayer dielectric 250 may include silicon oxide, oxynitride or other suitable materials. The interlayer dielectric 250 includes a single layer or multiple layers. The interlayer dielectric 250 can be formed by a suitable technique, such as CVD or ALD. In some embodiments, a contact etch stop layer (CESL) 248 may also be formed over the substrate 200 prior to forming the ILD layer 250. In some examples, the CESL 248 includes a silicon nitride layer, silicon oxide layer, a silicon oxynitride layer, and/or other materials known in the art. The CESL 248 may be formed by plasma-enhanced chemical vapor deposition (PECVD) process and/or other suitable deposition or oxidation processes.

Then, a chemical mechanical polishing (CMP) process may be performed to remove interlayer dielectric 250 (and CESL 248, if present) until reaching the dummy gate stack 220. After the chemical mechanical planarization (CMP) process, the dummy gate stack 220 is exposed from the interlayer dielectric 250.

Figure 14:
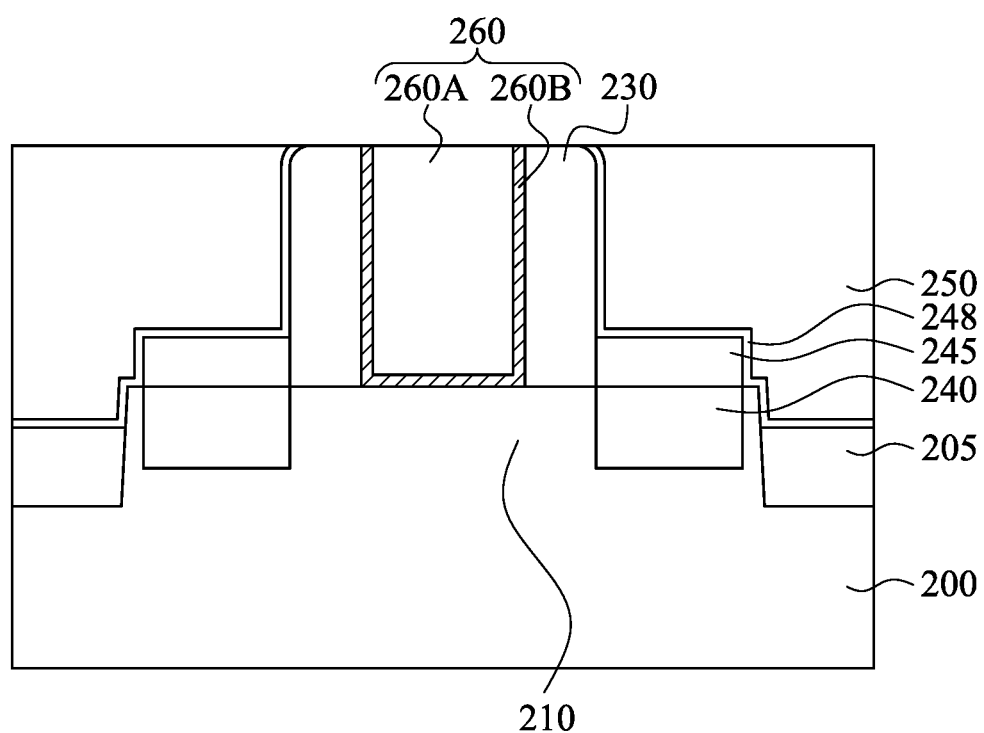

Reference is made to FIG. 14. A replacement gate (RPG) process scheme is employed. In a RPG process scheme, the dummy gate stack is formed first and is replaced later by a metal gate. In some embodiments, the gate electrode of the dummy gate stack 220 is removed to form an opening with the gate spacers 230 as its sidewall. In some other embodiments, the gate dielectric of the dummy gate stack 220 is removed as well. Alternatively, in some embodiments, the gate electrode is removed while the gate dielectric retains. The gate electrode (and the gate dielectric) may be removed by dry etch, wet etch, or a combination of dry and wet etch. For example, a wet etch process may include exposure to a hydroxide containing solution (e.g., ammonium hydroxide), deionized water, and/or other suitable etchant solutions.

The gate stack 260 is then formed in the opening between the gate spacers 230. In some embodiments, the gate stack 260 includes a gate metal 260A and a gate dielectric 260B. The gate dielectric 260B, as used and described herein, includes dielectric materials having a high dielectric constant, for example, greater than that of thermal silicon oxide (~3.9). The gate metal 260A may include a metal, metal alloy, and/or metal silicide.

In some embodiments, the gate metal 260A included in the gate stack may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide. For example, the gate metal 260A may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electro-plating and/or other suitable process.

In some embodiments, the interfacial layer may include a dielectric material such as silicon oxide ($SiO_2$), HfSiO, and/or silicon oxynitride (SiON). The interfacial layer may be formed by chemical oxidation, thermal oxidation, ALD, CVD, and/or other suitable method. The gate dielectric 260B may include a high-K dielectric layer such as hafnium oxide ($HfO_2$). Alternatively, the gate dielectric 260B may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectric 260B may be formed by ALD, PVD, CVD, oxidation, and/or other suitable methods.

Figure 15A:
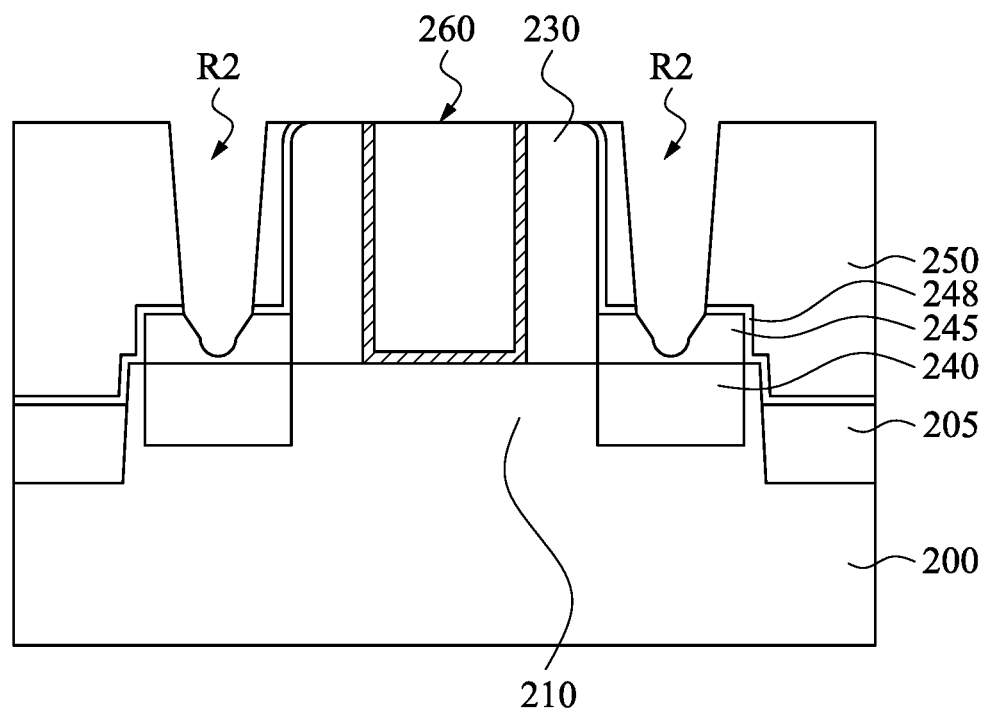
Figure 15B:
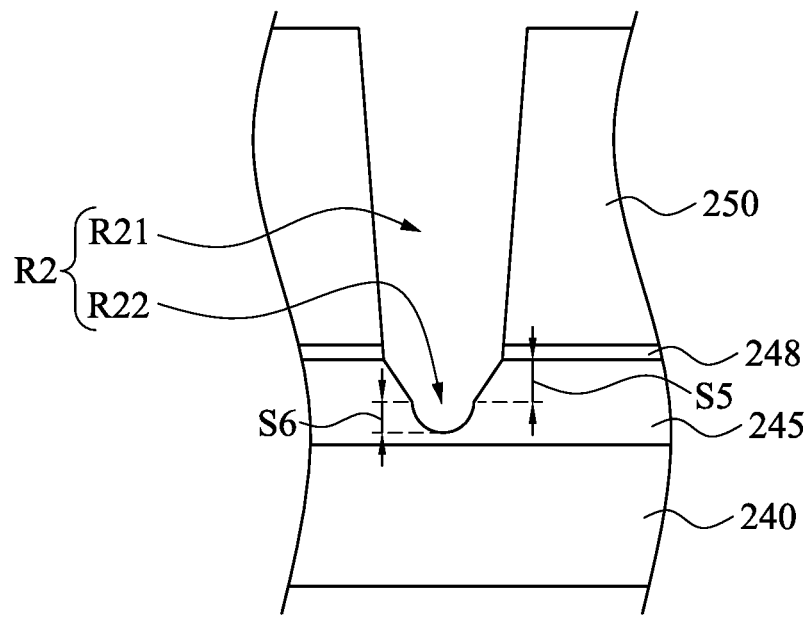

Reference is made to FIGS. 15A and 15B, in which FIG. 15B is a partial view of FIG. 15A. An etching process is performed to remove portions of the ILD layer 250, the CESL 248, and the silicide layer 245 to form a plurality of recesses R1 therein. The etching process may include dry etching, wet etching, or combinations thereof. In some embodiments, an etching process may be performed to remove portions of the ILD layers 250 and the CESL 248 to form recesses R21 therebetween, and then another etching process may be performed to remove portions of the silicide layers 248 to form recesses R22 therebetween. In some embodiments, the silicide layers 248 are recessed until reaching a level that does not expose the epitaxy structures 240. State another way, the etching process does not etch through the silicide layers 248 to expose the epitaxy structures 240. In some embodiments, the recesses R21 and the recesses R22 can be collectively referred to as recesses R2, where the recess R21 and the recess R21 can be also referred as the top portion and the bottom portion of the recess R22, respectively.

As shown in FIG. 15B, in greater detail, the recess R2 has a top portion R21 in the ILD layer 250 and the CESL 248, and a bottom portion R22 in the silicide layer 245, where the top portion R21 is in communication with the bottom portion R22. The height of the bottom portion R22 may be in a range of about 0.1 nm to about 20 nm in some embodiments, or may be in a range of about 0.1 nm to about 15 nm in some other embodiments.

In some embodiments, the bottom portion R21 of the recess R2 has a tapered profile that tapers from the top of the silicide layer 245 toward the bottom of the silicide layer 245, which in turn will facilitate the following bottom-up deposition using the capillary condensation mechanism. In some embodiments, the bottom portion R21 has a first segment S5 and a second segment S6 below the first segment S5, where the first segment S5 is in communication with the second segment S6. In some embodiments, the silicide layer 245 may undergo an etching process that slight removes a portion of the silicide layer 245 to form the first segment S5, and another etching process may be performed to further form the second segment S6.

The first segment S5 of the recess R22 has substantially slant straight side surfaces. In some embodiments, the slope of the side surface of the first segment S5 of the recess R22 is substantially lower than that of the recess R21. The second segment S6 of the recess R22 has substantially concave (rounded) bottom surface, and such shape in turn will be advantageous to increase the capillary condensation capability for filling a conductive material. In some embodiments, the radius of the curvature of the bottom surface of the recess R22 is in a range of about 1 nm to about 20 nm. In some embodiments, the parameters of the etching process are tuned to reduce the radius of curvature of the bottom surface of the second segment S6 of the recess R22, since a small radius of the curvature at the bottom may induce high capillary force for filling a conductive material.

In some embodiments, when the silicide layers 245 are made of titanium silicide. The dry etching may be performed via a capacitive coupled plasma (CCP), an inductive coupled plasma (ICP) source, an electron cyclotron resonance (ECR) plasma, or combinations thereof, with etchants of $CF_4$ and $O_2$. The wet etching may include etchants of HF and $H_2O$ in a ratio of about 1:1 to 1000, or etchants of NH$_4$F and H$_2$O$_2$ in a ratio of about 1:1 to 1000.

Figure 16:
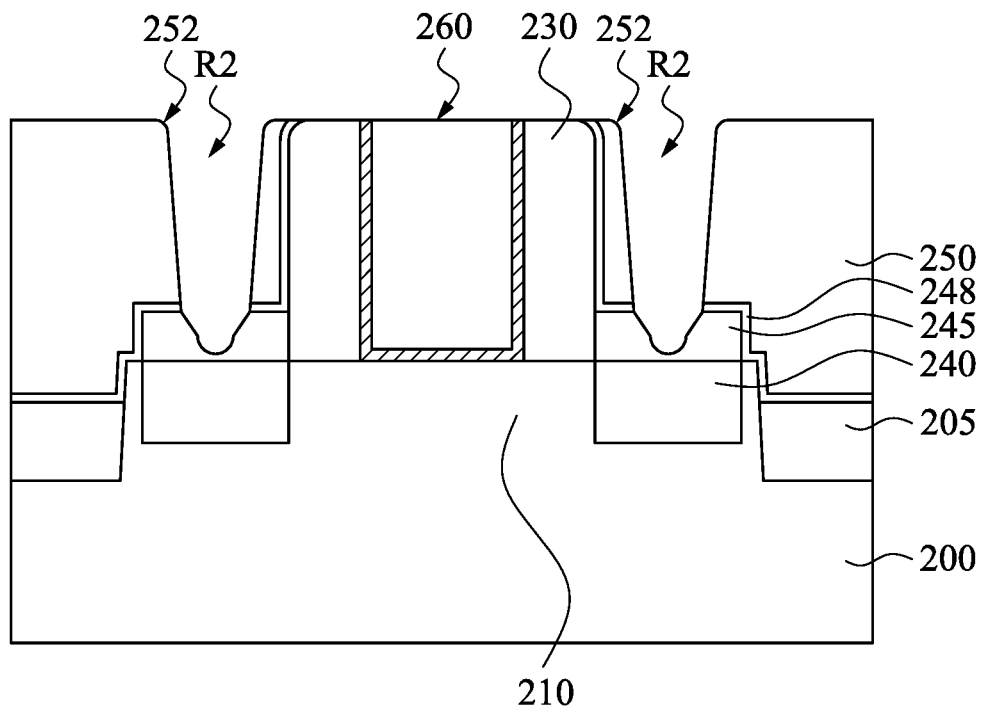

Reference is made to FIG. 16. The top corners of the recess R2 are rounded, so as to change sharp top corners of the recess R2 into rounded top corners 252, which in turn will further enlarge the recess R2 and facilitate the filling characteristic of the recess R2. The corners 252 are rounded substantially with the radius of curvature in a range of about 1 nm to about 30 nm. The horizontal length L2 between the top surface 250t of the ILD layer 252 and the bottom of the sidewall 250s of the ILD layer 250 may be defined as corner length L2. In some embodiments, the corner length L2 is in a range of about 0 nm to about 15 nm.

The corners 252 may be rounded by an etching process that etches the material(s) of the ILD layer 250 that makes up the corners 252. The etching process may be dry etching, wet etching, or combinations thereof. The removal of the ILD layer 250 during the etching process starts at the corners of recess R2 that have been created and progressively continues from these corners 252 down into the sidewalls of the recess R2. In some embodiments, the parameters of the etching process are tuned to increase the radius of curvature of the corners 252, which in turn will increase the capillary condensation capability for filling a conductive material, since the conductive material may flow easily down to the bottom of the recess R2.

Figure 17:
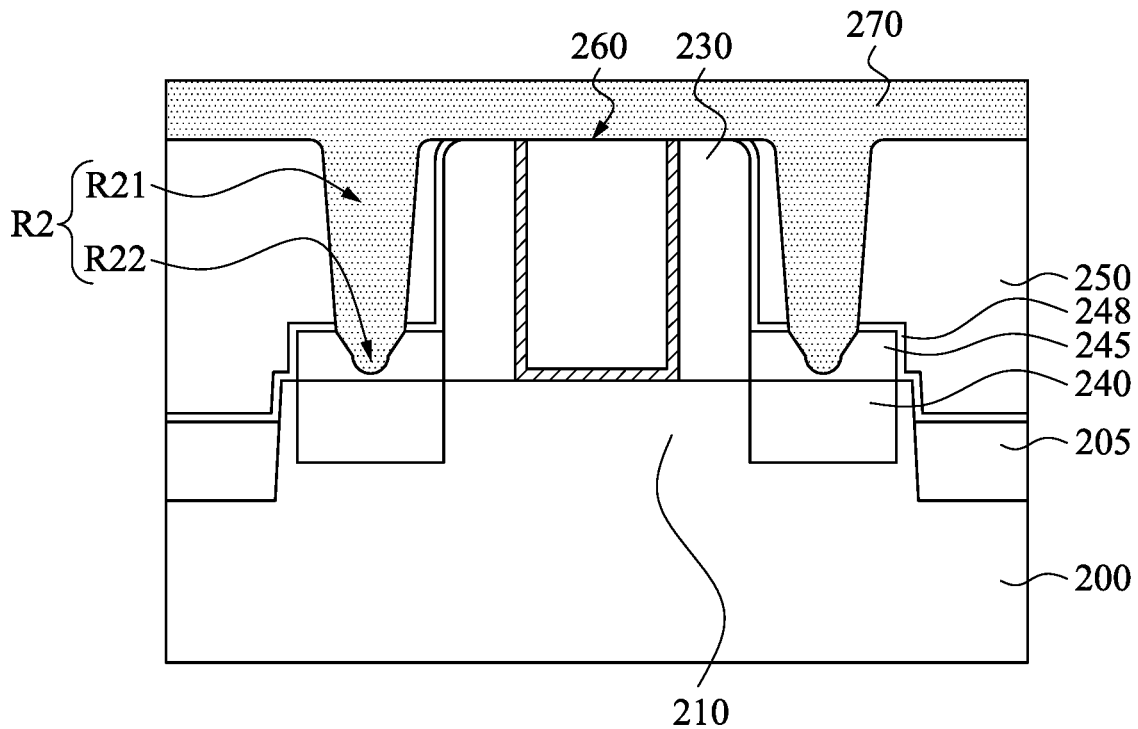

Reference is made to FIG. 17. A conductive material 270 is deposited into the recess R2 using a bottom-up approach, so that the recess R2 can be substantially filled with the conductive material 270. As mentioned before, the bottom portions R22 of the recesses R2 have a tapered profile, which enhances the capillary condensation capability of conductive material 270. In certain embodiments, the bottom-up deposition is a CVD deposition process involving capillary condensation mechanisms and thus is equivalently referred to as a capillary condensation CVD process hereinafter.

The capillary condensation CVD process selectively deposits metal in the narrowest confined space on the substrate, such as the bottom portion of the recesses R2 in the silicide layers 245. The precursor of the capillary condensation CVD process is initially provided in a vapor phase at a partial pressure (e.g., from 0.1 mTorr to about 100 mTorr) below its saturation pressure. Due to capillary condensation, the precursor vapor condenses as a liquid in the narrowest gaps (i.e., the recesses R22) even if the partial pressure of the precursor vapor is below its saturation pressure. This is due to an increased number of van der Waals interactions between vapor phase molecules inside the confined space of capillaries (i.e., the recesses R22). This propensity is employed to selectively fill the recess R22 with the precursor liquid. With the precursor liquid selectively confined to narrowest space, the precursor liquid is converted into a solid-phase deposited metal. This conversion may be achieved physically for example by solidification, or chemically by reacting the precursor liquid with another material to produce the solid material, or by decomposing the precursor.

Metal deposition using the capillary condensation CVD begins from the narrowest confined space, which in turn results in the "bottom-up" filling phenomenon, which in turn results in the recess R22 substantially filled with the conductive material 270. In some embodiments, the capillary condensation CVD process is performed until that the recess R2 is substantially filled with the noble metal, as illustrated in FIG. 17.

In some embodiments, the precursor of the capillary condensation CVD may be, for example, metal carbonyl, metal halide, the like or combinations thereof, and the carrier gas may include, for example, argon gas, hydrogen gas, the like, or combinations thereof. In some embodiments, an additional inhibition gas is employed during the capillary condensation CVD process. The inhibition gas results in improved "bottom-up" filling phenomenon because it inhibits metal nucleation on dielectric (e.g., on sidewalls of recesses R21 in the ILD layer 250 and the CESL 248). In some embodiments where the precursor includes metal carbonyl, the inhibition gas includes, for example, carbon monoxide (CO). In some embodiments where the precursor includes metal halide, the inhibition gas includes, for example, hydrogen halide.

In some other embodiments, an additional inhibition material can be formed on sidewalls of recesses R21 in the ILD layer 250 and the CESL 248 prior to the capillary condensation CVD process. The inhibition material results in improved "bottom-up" filling phenomenon because it inhibits metal nucleation on dielectric (e.g., on sidewalls of recess R21 in the ILD layer 250 and the CESL 248). In some embodiments where the precursor includes metal carbonyl, the inhibition gas includes, for example, carbon monoxide (CO). In some embodiments where the precursor includes metal halide, the inhibition gas includes, for example, hydrogen halide. The inhibition material may include SiOC$_x$H$_y$, SiOC$_x$Cl$_y$, or SiOC$_x$F$_y$. Thus, in some embodiments when the inhibition material is employed, the inhibition material (not shown) may present between the conductive material and the ILD layer 250 and the CESL 248.

In some embodiments, a noble metal (e.g., ruthenium) is a promising candidate for the conductive material 270 compared to other metals such as copper. This is due to the noble metal exhibits lower metal diffusion than other metals (e.g., copper). As a result, a diffusion barrier layer deposited prior to formation of the conductive material 270 may be omitted if the conductive material 270 include the noble metal. Omission of the diffusion barrier will contributes to an improved process window for depositing the conductive material 270 into the recesses R2.

In some embodiments, a pre-clean process is performed prior to the capillary CVD process. The pre-clean includes ion bombardment using a gas including hydrogen (H$_2$), argon, helium, nitrogen (N$_2$), the like, or combinations thereof. As a result of the bombardment, bonds of the materials (such as silicon oxide and/or nitride) exposed by the recesses R2 may be broken or loosen, which will facilitate formation of the conductive material 270 by reacting the noble metal with elements resulting from the broken bonds.

In some embodiments where the noble metal is ruthenium, the precursor may be, for example, ruthenium carbonyl, ruthenium tricarbonyl, ruthenium halide, the like or combinations thereof, and the carrier gas may include, for example, argon gas, hydrogen gas, the like or combinations thereof. In certain embodiments where the precursor is ruthenium tricarbonyl, the formation of conductive material 270 may be a cyclic process including at least one repetition of a deposition cycle and a cleaning cycle. For example, it may perform a deposition cycle followed by a cleaning cycle, and repeats the deposition and etching cycles. In some embodiments, the deposition cycle involves the capillary condensation CVD process as discussed previously and the cleaning cycle involves treating the recesses R2 with ion bombardment performed using a gas including hydrogen (H$_2$), argon, helium, nitrogen (N$_2$), the like, or combinations thereof. The ion bombardment is advantageous for forming the conductive material 270 on the sidewalls of the recesses R2 as discussed previously.

In some embodiments, if the conductive material 270 servers as a source/drain contact, the conductive material 270 may include low resistivity metal without barrier, such as ruthenium (Ru), iridium (Ir), nickel (Ni), osmium (Os), rhodium (Rh), aluminum (Al), molybdenum (Mo), tungsten (W), cobalt (Co), copper (Cu), or the like, can alternatively be utilized. In some other embodiments, if the conductive material 270 servers as conductive line or the conductive via of the interconnect structure, the conductive material 270 may include cobalt (Co), copper (Cu), ruthenium (Ru), nickel (Ni), aluminum (Al), platinum (Pt), molybdenum (Mo), tungsten (W), osmium (Os), iridium (Ir), chromium (Cr), or the like, can alternatively be utilized.

The conductive material 270 may be deposited by suitable process, such as CVD, PVD, or ALD. In some embodiments, the conductive material 270 may be deposited by CVD using a low vapor pressure precursor, such as $Cr(CO)_6$, $Co_4(CO)_{12}$, $Ru_3(CO)_{12}$, $Os_3(CO)_{12}$, $W(CO)_6$ for CVD, since the low vapor pressure precursor is more liquid-like and flows easily down to the recess. In some embodiments, the conductive material 270 may be deposited using carrier gas of oxygen ($O_2$), carbon (C), argon (Ar), nitrogen ($N_2$) or hydrogen (Hz) as carrier gas with flow rate in a range of about 1 to 500 sccm.

Figure 18A:
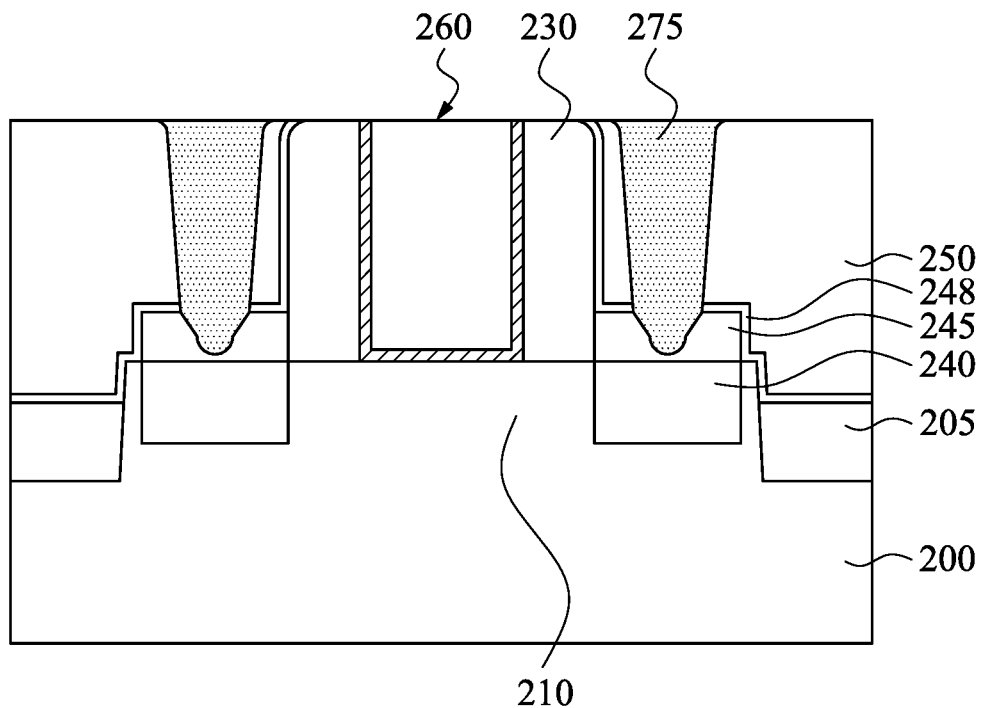
Figure 18B:
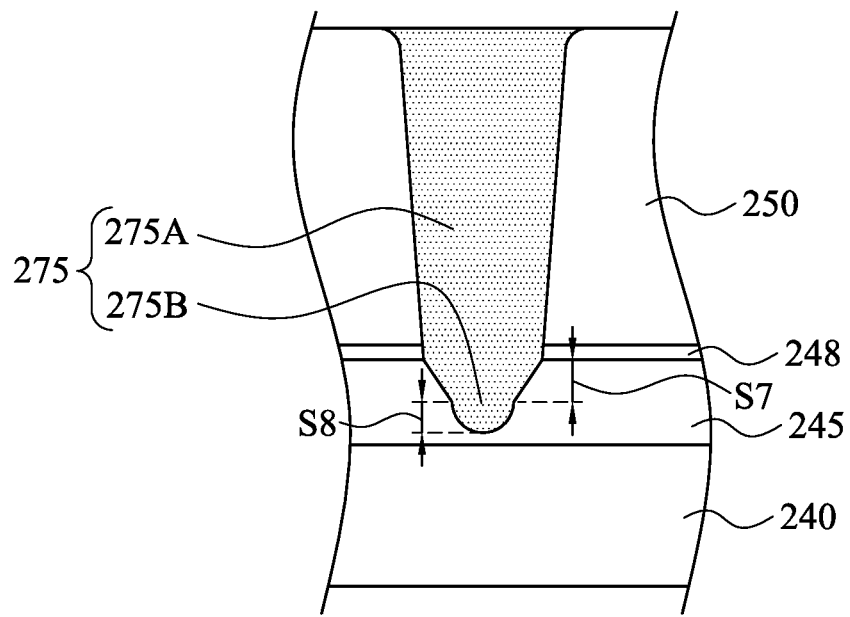

Reference is made to FIGS. 18A and 18B, in which FIG. 18B is a partial view of FIG. 18A. A chemical planarization polishing (CMP) is performed to remove the excessive conductive material 270 until reaching the top surfaces of the ILD layer 250 and the gate stack 260. The remaining conductive material 270 in the recesses R2 may be referred to as conductive features 275 in the following description, where the top surfaces of the conductive features 275 are substantially level with that of the ILD layer 250.

The conductive feature 275 substantially inherits the profile of the recesses R2 shown in FIG. 16. As illustrated in FIG. 18B, the conductive features 275 has a top portion 275A and a bottom portion 275B, where the top portion 275A is in the ILD layer 250 and the CESL 248, and the bottom portion 275B is embedded in the silicide layer 245. The top portion 275A has a tapered profile that tapers from the top of the conductive feature 275 to the bottom of the conductive feature 275. State another way, the top of the conductive feature 275A is wider than the bottom of the conductive feature 275A. On the other hand, the bottom portion 275B embedded in the silicide layer 245 has a tapered profile that tapers from the top of the silicide layer 245 toward the bottom of the silicide layer 245. In some embodiments, the bottom portion 275B of the conductive feature 275 has a first segment S7 and a second segment S8 below the first segment S7. The first segment S7 of the conductive feature 275B has substantially slant straight side surfaces. In some embodiments, the slope of the side surface of the first segment S7 of the conductive feature 275B is substantially lower than that of the conductive feature 275A. The second segment S8 of the conductive feature 275B has substantially rounded bottom surface. In some embodiments, the radius of the curvature of the bottom surface of the conductive feature 275B is in a range of about 1 nm to about 20 nm.

In some other embodiments, the bottom portion 275B of the conductive feature 275 may be in a shape that is the same as or similar to those described in FIGS. 7A to 7C, and details will not be repeated hereinafter.

According to the aforementioned embodiments, it can be seen that the present disclosure offers advantages over FinFET devices. It is understood, however, that other embodiments may offer additional advantages, and not all advantages are necessarily disclosed herein, and that no particular advantage is required for all embodiments. One advantage is that an etching process is performed to remove a portion of a non-insulator structure and form a recess therein prior to a conductive material filling process (e.g. forming a conductive feature that interconnects the non-insulator), such that a bottom-up deposition can be achieved to fill the narrow recess in the non-insulator structure by using a capillary condensation CVD process. Another advantage is that enhanced bottom-up deposition and hence reduced volume of seams or voids can be achieved by using an inhibition gas to inhibit metal nucleation on dielectric materials during the capillary condensation CVD. Another advantage is that corners of a recess of a dielectric layer are rounded prior to the capillary condensation CVD process to enlarge the deposition widow, such that the conductive material flows easily down to the recess of the non-insulator.

In some embodiments of the present disclosure, a semiconductor device includes a source/drain region, a silicide layer on the source/drain region, an interlayer dielectric (ILD) layer over the silicide layer, and a source drain contact. The source/drain contact having a top portion extending through the ILD layer and a bottom portion embedded in the silicide layer.

According to come embodiments, the bottom portion of the source/drain contact has a first segment and a second segment below the first segment, and the first segment and the second segment have different outer profiles According to come embodiments, the first segment of the bottom portion and the top portion have different outer profiles.

According to come embodiments, a sidewall of the first segment of the bottom portion has a slope lower than a sidewall of the top portion.

According to come embodiments, the outer profile of the second segment is rounded.

According to come embodiments, the bottom portion of the source/drain contact has a bottom surface and a sidewall extending from an edge of the flat bottom surface and slanted to the bottom surface.

According to come embodiments, the bottom portion of the source/drain contact has a pointed tip.

According to come embodiments, the bottom portion of the conductive feature has a convex surface.

In some embodiments of the present disclosure, an interconnection structure includes a first interlayer dielectric (ILD) layer, a metal line embedded in the first ILD layer, a second ILD layer over the metal structure, and a metal via. The metal via has a top portion extending through the second ILD layer and a bottom portion embedded in the metal structure.

According to come embodiments, the top portion and the bottom portion have different outer profiles.

According to come embodiments, the bottom portion has a first segment and a second segment below the first segment, and the first segment and the second segment have different outer profiles.

According to come embodiments, a width of the first segment is greater than a maximal width of the second segment.

According to come embodiments, a width of the top portion is greater than a maximal width of the bottom portion.

According to come embodiments, the bottom portion of the metal via has a cross-sectional profile in a shape of triangle, trapezoid, or arc.

In some embodiments of the present disclosure, a method includes forming a dielectric layer over a non-insulator structure; etching the dielectric layer and the non-insulator structure to form a recess through the dielectric layer and in the non-insulator structure; laterally expanding a first portion of the recess through the dielectric layer after forming the recess; and forming a conductive feature in the recess.

According to come embodiments, laterally expanding the dielectric layer includes rounding a top corner of the recess.

According to come embodiments, etching the non-insulator structure is performed such that a portion of the recess in the non-insulator structure tapers downwardly.

According to come embodiments, etching the non-insulator structure is performed such that the recess has a rounded bottom surface.

According to come embodiments, etching the dielectric layer and the non-insulator structure is performed such that the first portion of the recess and a second portion of the recess in the non-insulator structure have different outer profiles.

According to come embodiments, etching the non-insulator structure is performed such that a second portion of the recess in the non-insulator structure has a first segment and a second segment below the first segment, in which the first segment and the second segment have different outer profiles.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a source/drain region on a semiconductor substrate;
a silicide layer on the source/drain region;
an interlayer dielectric (ILD) layer over the silicide layer; and
a source/drain contact having a top portion extending through the ILD layer and a bottom portion embedded in the silicide layer, wherein the bottom portion of the source/drain contact has a slanted sidewall and a curved sidewall extending downwardly from the slanted sidewall and being more curved than the slanted sidewall.

2. The semiconductor device of claim 1, wherein the bottom portion of the source/drain contact has a first segment and a second segment below the first segment, and the first segment and the second segment have different outer profiles.

3. The semiconductor device of claim 2, wherein the first segment of the bottom portion and the top portion have different outer profiles.

4. The semiconductor device of claim 3, wherein a sidewall of the first segment of the bottom portion has a slope lower than a sidewall of the top portion.

5. The semiconductor device of claim 3, wherein the outer profile of the second segment is rounded.

6. The semiconductor device of claim 1, wherein the bottom portion of the source/drain contact has a pointed tip.

7. The semiconductor device of claim 1, wherein the bottom portion of the silicide layer has a convex surface.

8. An interconnection structure, comprising:
a first interlayer dielectric (ILD) layer;
a metal line embedded in the first ILD layer;
a second ILD layer over the metal line; and
a metal via having a top portion extending through the second ILD layer and a bottom portion embedded in the metal line, wherein the bottom portion of the metal via has a rounded end and sloped sidewalls extending upwardly from the rounded end, the sloped sidewalls being straighter than the rounded end.

9. The interconnection structure of claim 8, wherein the top portion and the bottom portion have different outer profiles.

10. The interconnection structure of claim 8, wherein the bottom portion has a first segment and a second segment below the first segment, and the first segment and the second segment have different outer profiles.

11. The interconnection structure of claim 10, wherein a width of the first segment is greater than a maximal width of the second segment.

12. The interconnection structure of claim 8, wherein a width of the top portion is greater than a maximal width of the bottom portion.

13. The interconnection structure of claim 8, wherein the bottom portion of the metal via has a cross-sectional profile in a shape of triangle, trapezoid, or arc.

14. A method, comprising:
forming a silicide layer over an epitaxy structure;
forming a dielectric layer over the silicide layer;
etching the dielectric layer and the silicide layer to form a recess through the dielectric layer and in the silicide layer, wherein the etching the dielectric layer and the silicide layer is performed such that the recess has a bottom portion in the silicide layer, the bottom portion has a first sidewall and a second sidewall extending below the first sidewall, and the first sidewall and the second sidewall form an angle;
laterally expanding a first portion of the recess through the dielectric layer after forming the recess; and
forming a conductive feature in the recess.

15. The method of claim 14, wherein laterally expanding the dielectric layer comprises rounding a top corner of the recess.

16. The method of claim 14, wherein etching the silicide layer is performed such that a portion of the recess in the silicide layer tapers downwardly.

17. The method of claim 14, wherein etching the silicide layer is performed such that the recess has a rounded bottom surface.

18. The method of claim 14, wherein the first sidewall and the second sidewall have different outer profiles.

19. The method of claim 14, wherein the first sidewall and the second sidewall have different slopes.

20. The method of claim 19, wherein the first sidewall is straighter than the second sidewall.

* * * * *